US007002293B2

(12) United States Patent
Madathil et al.

(10) Patent No.: US 7,002,293 B2
(45) Date of Patent: Feb. 21, 2006

(54) ORGANIC LIGHT EMITTING DIODE WITH IMPROVED LIGHT EMISSION THROUGH THE CATHODE

(75) Inventors: Joseph K. Madathil, Rochester, NY (US); Pranab K. Raychaudhuri, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 137 days.

(21) Appl. No.: 10/765,607

(22) Filed: Jan. 27, 2004

(65) Prior Publication Data

US 2005/0162075 A1      Jul. 28, 2005

(51) Int. Cl.
*H01J 1/63* (2006.01)
(52) U.S. Cl. .................................. 313/504; 313/506
(58) Field of Classification Search ................ 313/498, 313/503, 504, 506, 512
See application file for complete search history.

(56) References Cited

U.S. PATENT DOCUMENTS

| 4,769,292 A | 9/1988 | Tang et al. |
| 4,885,211 A | 12/1989 | Tang et al. |
| 6,465,953 B1 * | 10/2002 | Duggal ........................ 313/553 |

OTHER PUBLICATIONS

Tokito et al, Metal oxides as a hole-injecting layer for an organic electroluminescent device, J. Phys. D:Appl. Phys 29 (1996) 2750-2753.

Lu et al, High-efficiency top-emitting organic light-emitting devices, Applied Physics Letters, Nov. 2002, pp. 3921-3923.
Raychaudhuri et al, Fabrication of Sputtered Cathode for Organic Light-Emitting Diodes (OLED) Using Transparent Buffer, Proceedings of the 7th Asian Symposium on Information Display (ASID 2002), pp. 55-58.
Van Slyke et al, Organic electroluminescent devices with improved stability, Appl. Phys. Lett. 69 (15) Oct. 7, 1996, pp. 2160-2162.

* cited by examiner

*Primary Examiner*—Vip Patel
(74) *Attorney, Agent, or Firm*—Raymond L. Owens

(57) ABSTRACT

Top-emitting organic light-emitting diode devices include a reflective, opaque, and conductive anode layer including a metal or metal alloy or both formed over a transparent or an opaque substrate, a plurality of hole-injecting layers including a bilayer structure having a layer including an oxide and a layer including a fluorinated carbon disposed over the reflective, opaque, and conductive anode, a plurality of organic layers formed over the plurality of hole-injecting layers and including an emissive layer having electroluminescent material and a reflective, semitransparent and conductive cathode include a metal or metal alloy or both provided over the plurality of organic layers, and the plurality of the hole-injecting layers being configured to reduce the drive voltage, and the reflectivity of the anode, the transparency of the cathode, and the thickness of the organic layers between the electrodes being selected to change the internal reflection of light.

22 Claims, 3 Drawing Sheets

ORGANIC LIGHT EMITTING DIODE WITH IMPROVED LIGHT EMISSION THROUGH THE CATHODE

CROSS REFERENCE TO RELATED APPLICATIONS

Reference is made to commonly assigned U.S. patent application Ser. No. 10/347,013 filed Jan. 17, 2003 by Pranab K. Raychaudhuri et al, entitled "Organic Light-Emitting Diode (OLED) Display With Improved Light Emission Using a Metallic Anode", commonly assigned U.S. patent application Ser. No. 10/346,424 filed Jan. 17, 2003 by Yuan-Sheng Tyan et al, entitled "Microcavity OLED Devices", and commonly-assigned U.S. patent application Ser. No. 10/765,375 filed concurrently herewith, by Joseph K. Madathil et al, entitled "Organic Light Emitting Diode With Improved Light Emission Through the Substrate", the disclosures of which are herein incorporated by reference.

FIELD OF THE INVENTION

The present invention relates to a top-emitting organic light emitting diodes (OLEDs), which use a semitransparent metallic cathode.

BACKGROUND OF THE INVENTION

Organic electroluminescent (OEL) device, alternately known as organic light emitting diode (OLED), is useful in flat-panel display applications. This light-emissive device is attractive because it can be designed to produce red, green, and blue colors with high luminance efficiency; it is operable with a low driving voltage of the order of a few volts and clearly viewable from oblique angles. These unique attributes are derived from a basic OLED structure comprising of a multilayer stack of thin films of small-molecule organic materials sandwiched between an anode and a cathode. Tang et al in commonly-assigned U.S. Pat. Nos. 4,769,292 and 4,885,211 have disclosed such a structure. The common electroluminescent (EL) medium is comprised of a bilayer structure of a hole-transport layer (HTL) and an electron-transport layer (ETL), typically of the order of a few tens of nanometer (nm) in thickness for each layer. When an electrical potential difference is applied at the electrodes, the injected carriers—hole at the anode and electron at the cathode—migrate towards each other through the EL medium and a fraction of them recombine to emit light. The intensity of electroluminescence is dependent on the EL medium, drive voltage, and charge injecting nature of the electrodes. The light viewable outside of the device is further dependent on the design of the organic stack and optical properties of the substrate, anode and the cathode.

Conventional OLEDs are bottom emitting (BE), meaning that the display is viewed through the substrate that supports the OLED structure. The devices normally employ glass or other transparent substrates having a layer of transparent anode layer, generally of indium-tin-oxide (ITO). The cathode is typically an opaque and reflective thin film of MgAg, although lithium-containing alloys are also known to provide efficient electron injection. The light generated within the device is emitted in all directions. About 80% of generated light is not available for viewing due to losses in wave-guiding modes in glass, ITO and organic layers. The light emitted toward the anode at less than the critical angle passes through the anode and the substrate to the viewer, and the light emitted in the opposite direction is reflected at the cathode and passes through the substrate, enhancing the viewing intensity. A high-transparency substrate and anode and a high-reflectivity cathode are thus preferred.

The OLEDs are typically coupled with active matrix (AM) circuitry in order to produce high performance displays. In BE OLEDs, the circuitry (bus metals, thin film transistors (TFTs), and capacitors) is competing with pixel-emitting areas for space in the substrate. For these displays employing complex circuitry in the backplane the open area through which the light emerges is reduced. The ratio of the open area to that of the entire device area is called the aperture ratio. Due to reduction of the aperture ratio the display will run dim. To compensate for the reduced average brightness level, the drive current is increased subjecting the display to increased risk of operational degradation. It follows that more complex pixel drive circuitry cannot be readily implemented without further compromising aperture ratio and operation stability.

In top-emitting design the drive circuitry is fabricated on substrate and the light emits from the opposite surface. This design permits the use complex circuitry occupying whatever substrate space is needed and the aperture ratio is not affected. The high aperture ratio makes the display viewable consuming less power. The devices employing opaque backplanes such as silicon the OLED must be of the top-emitting type.

The top-emitting devices with inherently high aperture ratio are power efficient. But any device design should also be aimed at achieving highest possible efficiency. These devices have the prospect of running at low drive current while maintaining readability and thus extending the operational life. However, realizing high efficiency by reclaiming light lost to waveguiding modes can be very difficult. To recover even a fraction of light the device architecture can be very complex.

An approach to enhance the efficiency without introducing such complexity is to implement the microcavity design of the device structure as has been described. By employing a microcavity structure including highly reflective electrodes it is possible to significantly increase the out coupling of generated light. In the microcavity device the light emitted out of the cavity depends on the cavity design. The resonance wavelength of a microcavity is given by $$2\Sigma(n_i d_i)/\lambda - (\Phi_1 + \Phi_2)/360° = m,$$

where m=0, 1, 2, ..., $\lambda$ is the peak wavelength of the light emerging out of the cavity consisting of layers having the thickness $d_i$ and refractive index $n_i$, and $\Phi_1$ and $\Phi_2$ are the phase shifts of light in degrees upon reflection from the two reflecting electrodes. The quantity $n_i d_i$ is conventionally called the "optical path length" in the material, so $\Sigma(n_i d_i)$ is the total optical path length in the microcavity. For a fixed optical path length of the microcavity, the strength of this emission (and to a much lesser degree its wavelength) is also influenced by the location of the emission zone within the cavity. If a reasonable distance between the cathode and HTL/ETL interface is selected, then the HTL thickness can be varied in order to vary the optical path length of the microcavity. The maximum luminance occurs for an HTL thickness such that the resonance wavelength of the microcavity is well-aligned with the peak in the innate emission spectrum of the particular dopant-host material. The first maximum occurs at the HTL thickness corresponding to m=0, and subsequent maxima occur at the HTL thickness corresponding to m=1, 2 and so on.

FIG. 1 is a plot of luminance of a top-emitting microcavity structure as a function of NPB HTL thickness up to the thickness corresponding to m=1 as determined by optical modeling. The structure of the OLED is: Glass/80 nm Ag/variable NPB/60 nm Alq/14 nm MgAg and includes the fully reflective Ag anode deposited on the glass substrate. The MgAg top electrode is the cathode, and being thin and semitransparent allows significant emission through the top surface of the OLED.

The FIG. 1 shows that for this structure the first maximum of the luminance occurs at 46 nm and the second maximum occurs at 196 nm of NPB thickness. It is obvious that such plots for the emission at other wavelengths will be similar to the FIG. 1 but the cavity length will be slightly different, and the maxima of resonance wavelengths will occur at slightly different NPB thicknesses. It has been found, however, that the OLED based on the above layer structure was inefficient. An interlayer between the Ag anode and the NPB HTL was found useful in lowering the operating voltage and improving the stability of the diode. The interlayer, including a fluorinated carbon or an oxide, is very thin (1 to 2 nm thick) and highly transparent. It thus does not significantly affect the optics of the OLED structure. The OLED structure with 46 nm NPB is most desirable for maximizing efficiency and minimizing the angular dependence of the color but the one with the 196 nm NPB can be desirable from a manufacturing point of view. This is because the thin NPB can yield shorted OLEDs or OLEDs that can catastrophically fail in use. On the other hand, a thick NPB HTL is likely to increase the drive voltage. It has been found, however, that the drive voltage of OLEDs having a $MoO_x$ HIL on an Ag anode and 200 nm NPB HTL is higher than can be accounted for solely by increased NPB thickness.

SUMMARY OF THE INVENTION

It is therefore an object of the present invention to provide a top-emitting OLED with reduced drive voltages.

It is another object of the present invention to provide a top-emitting OLED with high operational stability.

It is another object of the present invention to provide a top-emitting OLED with high efficiency.

These objects are achieved by top-emitting OLED device, comprising:

a) a transparent or an opaque substrate;

b) a reflective, opaque, and conductive anode layer including a metal or metal alloy or both formed over the substrate;

c) a plurality of hole-injecting layers disposed over the reflective, opaque, and conductive anode layer, including a bilayer structure having a layer including an oxide and a layer including a fluorinated carbon;

d) a plurality of organic layers formed over the plurality of hole-injecting layers and including an emissive layer having electroluminescent material;

e) a reflective, semitransparent and conductive cathode including a metal or metal alloy or both provided over the plurality of organic layers; and f) the plurality of the hole-injecting layers being configured to reduce the drive voltage, and the reflectivity of the anode, the transparency of the cathode, and the thickness of the organic layers between the electrodes being selected to change the internal reflection of light to thereby improve the emission through top surface.

It has been discovered that, by using a bilayer configuration, for the hole-injection structure having an oxide layer and a fluorocarbon layer, the drive voltage is reduced, top-emission and operational stability are enhanced as well.

DETAILED DESCRIPTION OF THE INVENTION

Throughout the ensuing description acronyms are used to designate the names of the different organic layers and operating features of organic light-emitting diode. For reference they are listed in Table 1.

TABLE 1

| OLED | Organic light-emitting diode |
|---|---|
| ITO | Indium tin oxide |
| HIL | Hole- injection layer |
| $CF_x$ | Fluorinated carbon |
| $MoO_x$ | Molybdenum oxide |
| HTL | Hole-transport layer |
| EML | Emissive layer |
| ETL | Electron-transport layer |
| TEL | Transmission enhancement layer |
| NPB | 4,4'-Bis[N-(1-naphthyl)-N-phenylamino]biphenyl (NPB) |
| Alq | Tris(8-hydroxyquinoline) aluminum |
| MgAg | Mg(95 v %) Ag(5 v %) alloy |

Figure 2:
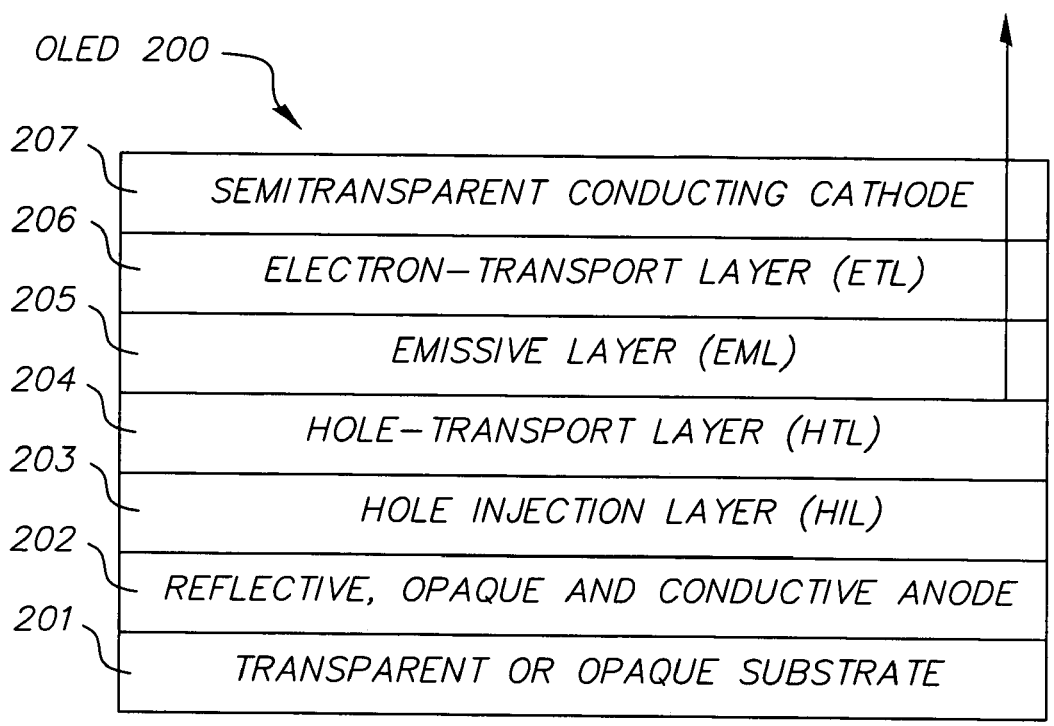
FIG. 2 shows schematically the layer structure of a top-emitting microcavity OLED of prior art.

Turning now to FIG. 2, OLED 200 is a prior art top-emitting microcavity OLED comprising an opaque or a transparent substrate 201, a reflective, opaque, and conductive anode 202, a hole-injection layer (HIL) 203, a hole-transport layer (HTL) 204, an emissive layer (EML) 205, an electron-transport layer (ETL) 206, and a reflective, semitransparent and conductive cathode 207. In operation, the anode and the cathode are connected to a voltage source and electrical current is passed through the organic layers, resulting in light emission or electroluminescence from the emissive layer. The intensity of generated light is dependent on the magnitude of the electrical current passed through the OLED, which in turn is dependent on the luminescent and electrical characteristics of the organic layers as well as the charge-injecting nature of the anode 202, hole-injection layer 203, and cathode 207. The light is emitted out of the OLED through the top semitransparent cathode as indicated by the arrow in FIG. 2. The luminance as viewed is also strongly dependent on the optical characteristics of the anode 202, cathode 207 and the layer structure of the OLED.

Figure 3:
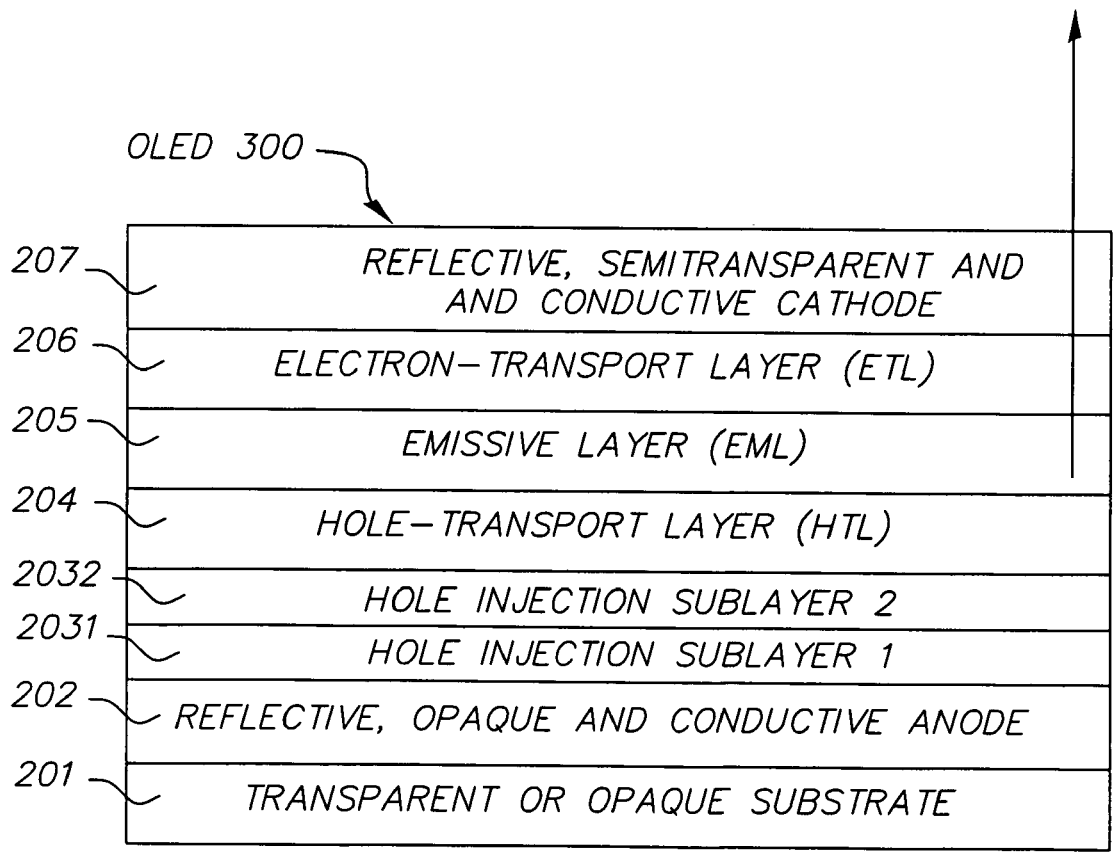
FIG. 3 shows schematically the layer structure of a top-emitting microcavity OLED of the present invention.

FIG. 3 shows the structure of a top-emitting microcavity OLED of the present invention. In this configuration the layer 2031 is a hole-injecting layer disposed on the reflective, opaque and conductive anode 202; the layer 2032 is another hole-injecting layer inserted between the hole-injecting layer 2031 and the hole-transporting layer 204. The layers 2031 and 2032 thus constitute a bilayer hole-injecting structure otherwise the OLED 300 is similar to prior art OLED 200 (FIG. 2). The layer 2031 and the layer 2032 may be termed as the hole-injection sublayer 1 and hole-injection sublayer 2, respectively.

Figure 4:
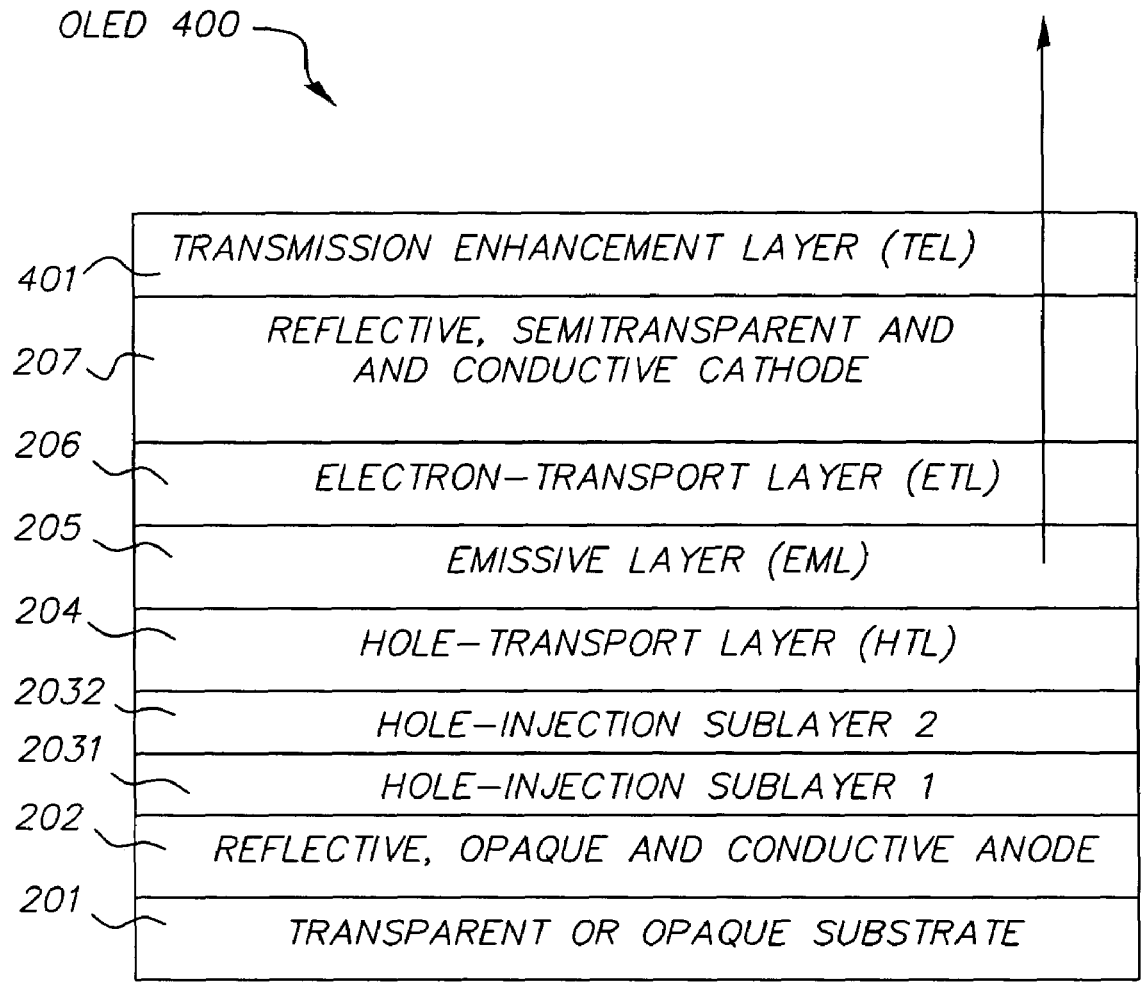
FIG. 4 shows schematically the layer structure of another embodiment of the top-emitting microcavity OLED of the present invention.

In another embodiment of the present invention shown in FIG. 4 a transmission enhancement layer 401 is placed over the reflective, semitransparent and conductive cathode 207 to further enhance the emission through top electrode of the OLED. The OLED 400 is otherwise similar to the OLED 300. However the optical characteristics of the transmission enhancement layer 401 and the OLED 400 structure can be optimized to achieve maximization of emission through the top cathode 207.

Substrate 201 can include glass, ceramic, plastics, or any other materials. For devices emitting through the top surface, the substrates need not be transparent and can include silicon or other semiconducting materials. Since the OLED fabrication does not require high temperature process, any substrate that can withstand process temperatures of the order of 100° C. is useful, which includes most thermal plastics. The substrate can take the form of rigid plate, flexible sheet, or curved surfaces. Substrate 201 can include support with electronic backplane, and thus includes active-matrix substrates, which contain electronic addressing and switching elements. Active-matrix substrates can contain high temperature polysilicon thin-film-transistors, low temperature polysilicon thin-film-transistors or amorphous silicon thin film transistors. Those skilled in the art will appreciate that other circuit elements can be used to address and drive the OLED.

Anode 202 (FIGS. 2–4) provides the function of injecting holes into the organic layer when a positive potential relative to the cathode is applied to the OLED. Metallic layers can be usable as anodes as, in addition to being a conductive reflector, can function as hole injectors. For high-efficiency OLEDs the anode should be highly reflective and can comprise materials including alloys having substantially high reflectance at the emission wavelength. Such metals include Ag, Al, Mg, Zn, Rh, Ru, Ir, Au, Cu, Pd, Ni, Cr, Pt, Co, Te, Mo, Hf, Fe, Mn, Nb, Ge, Os, Ti, V, or W, or alloys or mixtures thereof. The anode 202 (FIGS. 2–4) can be deposited by conventional deposition processes and can also be compatible with the manufacturing process for OLED. By substantially high reflectance it is meant that the reflectance of the metallic layer on a glass substrate is at least 40%. The term opaque means the transmission of the film on glass is less than 10%. Depending on the metals the thickness of the layer should be greater than 40 nm. These layers can function as anodes with good hole-injecting properties with and without an overlying hole-injecting layer 203 (FIG. 2) or 2031 and 2032 (FIGS. 3 and 4). In general high workfunction materials are believed to inject holes to NPB HTL with reasonably high efficiency whereas the low workfunction materials are likely to be inefficient hole injectors. However it has been found that the anode layer 202 comprising low or and high workfunction materials can further benefit from an overlying hole injecting layer.

Hole-injection layer 203 provides the function of increasing the efficiency of the hole-injection from the anode 202 into the HTL 204 (FIG. 2). A preferred HIL material that can increase luminance efficiency is comprised of $CF_x$, wherein x is less than or equal to 3 and greater than 0. The $CF_x$ is a fluorinated polymer deposited by decomposing $CHF_3$ gas in RF plasma. The method of preparation and the characteristics of $CF_x$ have been disclosed in commonly assigned U.S. Pat. No. 6,208,077. The layer thickness of $CF_x$ generally employed was about 1 nm although thickness up to about 5 nm was found usable. Other materials can also be used as hole injectors. These include oxides of Mo, V or Ru. A layer of these materials on ITO has been found useful as a hole injector to TPD, an HTL layer ("Metal oxides as a hole-injecting layer for an organic electroluminescent device", S. Tokito, K. Noda and Y. Taga, J. Phys. D; Appl. Phys. 29, 2750 (1996)). Since MoOx is reasonably conductive and transparent, its usable thickness can be up to several tens of nanometers. Since the hole injectors can be thin or transparent or both the reflectivity of the anode layer is likely to be preserved. For low workfunction metal anodes, which do not efficiently inject holes to the hole-transport layer, a hole-injecting layer on the metal anode can be useful. Other conducting oxides such as ITO on metal anode can function as a hole-injector as ITO has high transparency has a relatively high work function. An ITO coating on Ag reflector has been reported to function as an efficient anode structure for a microcavity OLED. (M.-H. Lu, M. S. Weaver, T. X. Zhou, M. Rothman, R. C. Kwong, M. Hack, and J. J. Brown, "High-efficiency top-emitting organic light-emitting devices", Appl. Phys. Lett. 81, 3921 (2002)). Other hole injectors for metal anodes can include IZO, $Pr_2O_3$, $TeO_2$, $SiO_2$, or mixtures thereof. High workfunction metal anode can also benefit from a hole-injecting layer. ("Performance Enhancement of Top- and Bottom-Emitting Organic Light-Emitting Devices Using Microcavity Structures", P. K. Raychaudhuri, J. K. Madathil, Joel D. Shore and Steven A. Van Slyke, Proceedings of the 23rd International Display Research Conference, Phoenix, Ariz., Sep. 16 to 18, 2003 p 10). In prior art OLEDs $CF_x$ or an oxide of Mo has been used as the efficient hole-injecting layer 203 (FIG. 2) on low or high workfunction metallic anodes. The oxide layer $MoO_x$ (x<3.0) is prepared by vacuum evaporation of $MoO_3$ and the deposited film can be non-stoichiometric. In accordance with the present invention, it is found that when the $MoO_x$ and the fluorocarbon are used in combination the drive voltage is reduced for OLEDs particularly having a thick hole-transport layer. In the structure of the present invention (FIG. 3 and FIG. 4) the hole injecting oxide layer 2031 (hole-injection sublayer 1 or sublayer 1) is in contact with the metallic anode 202 and the hole injecting fluorocarbon layer 2032 (hole-injection sublayer 2 or sublayer 2). The sublayer 2 is in contact with the sublayer 1 and hole transport layer 204. Thus the hole injecting structure of the present invention includes the hole injecting sublayer 1 and the hole injecting sublayer 2.

Hole-transport layer 204 provides the function of transporting holes to the emissive layer (EML) 205. HTL materials include various classes of aromatic amines as disclosed in commonly assigned U.S. Pat. No. 4,720,432. A preferred class of HTL materials includes the tetraaryldiamines of formula (I).

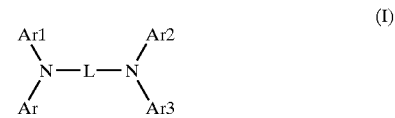

(I)

wherein:
Ar, Ar1, Ar2 and Ar3 are independently selected from among phenyl, biphenyl and naphthyl moieties;
L is a divalent naphthylene moiety or dn;
d is a phenylene moiety;
n is an integer of from 1 to 4; and
at least one of Ar, Ar1, Ar2 and Ar3 is a naphthyl moiety.

Figure 1:
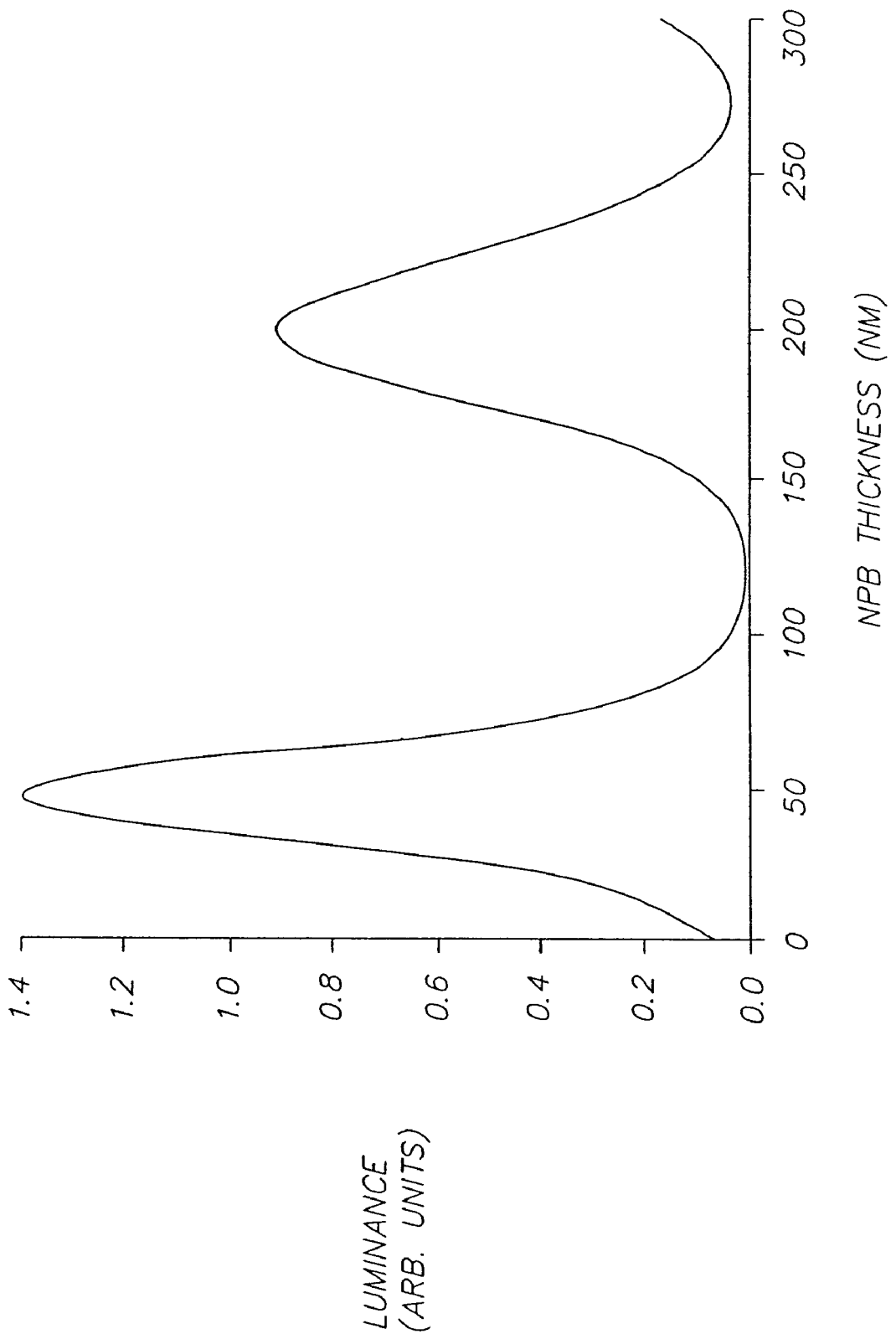
FIG. 1 shows the on-axis luminance determined by optical modeling of a top-emitting OLED as a function of the NPB HTL thickness in the following diode structure: Glass/80 nm Ag/variable NPB/60 nm Alq/14 nm MgAg.

Useful selected (fused aromatic ring containing) aromatic tertiary amines are the following:
4,4'-Bis[N-(1-naphthyl)-N-phenylamino]biphenyl (NPB)
4,4"-Bis[N-(1-naphthyl)-N-phenylamino]-p-terphenyl
4,4'-Bis[N-(2-naphthyl)-N-phenylamino]biphenyl
1,5-Bis[N-(1-naphthyl)-N-phenylamino]naphthalene
4,4'-Bis[N-(2-pyrenyl)-N-phenylamino]bi-phenyl
4,4'-Bis[N-(2-perylenyl)-N-phenylamino]biphenyl
2,6-Bis(di-p-tolylamino)naphthalene
2,6-Bis[di-(1-naphtyl)amino]naphthalene The modeling covering only a limited range of NPB thickness presented in FIG. 1 shows that for the OLED structures (FIGS. 2–4) the thickness of NPB layer should be about 46 or 196 nm for maximization of green emission. The appropriate thickness of NPB for emission of other colors is slightly different. The thickness of the hole-transport layer for all color top-emitting device should be is in the range of 20 nm to 80 nm or 180 nm to 230 nm.

Emissive layer 205 (FIGS. 2–4) provides the function of light emission produced as a result of recombination of holes and electrons in this layer. A preferred embodiment of the emissive layer includes a host material doped with one or more fluorescent dyes. Using this host-dopant composition, highly efficient OLED can be constructed. Simultaneously, the color of the EL devices can be tuned by using fluorescent dyes of different emission wavelengths in a common host material. Tang et al. in commonly assigned U.S. Pat. No. 4,769,292 has described this dopant scheme in considerable detail for OLED using Alq as the host material. As set forth in the Tang et al. commonly assigned U.S. Pat. No. 4,769,292, the emissive layer can contain a green light-emitting doped material, a blue light-emitting doped material, or a red light-emitting doped material.

Preferred host materials include the class of 8-quinolinol metal chelate compounds with the chelating metals being Al, Mg, Li, Zn, for example. Another preferred class of host materials includes anthracene derivatives such as 9,10 dinaphthyl anthracene; 9,10 dianthryl anthracene; and alkyl substituted 9,10 dinaphthyl anthracene, as disclosed in Shi et al. commonly assigned U.S. Pat. No. 5,935,721.

Dopant materials include most fluorescent and phorphorescent dyes and pigments. Preferred dopant materials include coumarins such as coumarin 6, dicyanomethylenepyrans such as 4-dicyanomethylene-4H pyrans, as disclosed in Tang et al. commonly assigned U.S. Pat. No. 4,769,292 and in Chen et al. in commonly assigned U.S. Pat. No. 6,020,078.

Electron-transport layer 206 (FIGS. 2–4) provides the function of delivering electrons injected from the cathode to emissive layer 205 (FIGS. 2–4). Useful materials include Alq, benzazoles, as disclosed in commonly assigned Shi et al. commonly assigned U.S. Pat. No. 5,645,948.

The EML/ETL thickness typically used is about 60 nm and since the hole injecting layers is negligibly thin, the combined thickness of all layers (layers 204, 205 and 206, FIGS. 2–4) between the anode and cathode is in the range of 70 nm to 150 nm or 230 nm to 330 nm.

Cathode 207 (FIGS. 2–4) is the top electrode through which light passes out of the device. The cathode is typically a conducting, semitransparent, reflective and weakly absorbing thin film capable of efficiently injecting electrons into the ETL 206, (FIGS. 2–4) and is comprised of materials including alloys having a work function selected to be about 4.0 eV or less. Mg and Li containing alloys are generally used because they have low work functions and make efficient electron-injecting contacts to Alq ETL. Other materials with work-functions of <4.0 eV such as Mn can also be used as the electron injectors. Alternately, an effectively a transparent electron injecting layer can be formed over the ETL 206 by depositing an ultrathin layer of an alkali metal or alkali earth metal or combinations thereof, or by depositing a compound of an electron injecting dopant and an activator metal like Al, Mg etc. The surface allows the use of any metal or alloy regardless of the work-function to yield a weakly absorbing top cathode with improved properties. By weakly absorbing it is meant that the absorption of a film on glass is 30% or less over the visible wavelengths. The reflectivity of such layers can be about 30% or greater. Depending on the metals the thickness of the layer 207 (FIGS. 2–4) should be greater than about 4 nm but less than about 50 nm.

Transmission enhancement layer (TEL) 401 (FIG. 4) is a highly transmissive film disposed over the reflective, semitransparent and conductive cathode layer 207 to further increase the emission through the top surface of the device. The TEL includes conductive or nonconductive organic or inorganic materials including but not limited to: ITO, indium zinc oxide (IZO), tin oxide (TO), antimony-doped tin oxide (ATO), fluorine-doped tin oxide (FTO), indium oxide (IO), zinc oxide (ZO), cadmium stannate (CTO), cadmium oxide, phosphorus-doped TO, and aluminum-doped ZO, MgO, $MoO_x$, $SiO_2$ $Al_2O_3$ $TiO_2$, $ZrO_2$, SiN, AlN, TiN, ZrN, SiC, $Al_4C_3$, Alq or NPB or mixtures thereof. Depending on the optical indices of the material the thickness of the layer 401 can range from 20 nm to 150 nm.

The organic materials mentioned above are suitably deposited by evaporation in high vacuum. The metal or alloy cathode layers are also vapor deposited although it is possible to use sputtering deposition if the device architecture includes a suitable buffer (P. K. Raychaudhuri and J. K. Madathil, "Fabrication of Sputtered Cathodes for Organic Light-Emitting Diodes Using Transparent Buffer", Proceedings of the 7th Asian Symposium on Information Display (September 2–4, Singapore a) Digest, paper 50; Vol. 32, pp. 55–58, 2002).

Most OLED devices are sensitive to moisture or oxygen or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as $SiO_x$, Teflon, and alternating inorganic/polymeric layers are known in the art for encapsulation.

OLED devices of this invention can employ various well-known optical effects in order to enhance their properties if desired. This includes optimizing layer thicknesses to yield maximum light transmission, replacing reflective electrodes with light-absorbing electrodes to enhance contrast, providing anti-glare or anti-reflection coatings over the display, providing a polarizing medium over the display, or providing colored, neutral density, or color conversion filters over the display. Filters, polarizers, and anti-glare or anti-reflection coatings can be specifically provided over the cover or as part of the cover.

EXAMPLES

Prior art OLEDs and the OLEDs of the present invention were fabricated on glass substrates. The glass plates were coated with an opaque, 80 nm thick Ag layer by sputtering in Ar containing atmosphere. These metallized glass plates were then coated either with a $CF_x$ hole-injection layer or with a vapor deposited $MoO_x$ hole injection layer or with the two hole-injection layers in combinations The $CF_x$ layer was deposited by decomposing $CHF_3$ gas in RF plasma. The $MoO_x$ layer was prepared by evaporation of $MoO_3$ in high vacuum The substrates were then transferred to a vacuum coater operating at $\sim 1\times 10^{-6}$ Torr, where the organic stack comprising NPB HTL, and Alq EML/ETL were deposited in sequence. Then a semitransparent, MgAg alloy (5 v % Ag) layer was deposited through a square mask, which defined an active area of 0.1 $cm^2$ for the OLED. Finally, the OLEDs were hermetically encapsulated in a glove box filled with dry nitrogen. When energized the emitted light emerged through the semitransparent top cathode. The luminance of the OLEDs was determined using a Photo Research PR650 spectroradiometer as a function of current. The drive voltage and luminance given here are those obtained when a current corresponding to 20 $mA/cm^2$ was passed through the OLEDs and luminance being determined in the direction normal to the device surface.

The operational stability of the OLEDs was tested at a constant current of 80 $mA/cm^2$ as outlined by VanSlyke et.al ("Organic electroluminescent devices with improved stability" S. A. VanSlyke, C. H. Chen, and C. W. Tang, Appl. Phys. Lett. 69, 2160 (1996). The drive voltage was continuously adjusted to keep the operational current fixed. From these data were determined two parameters characteristic of operational degradation of the OLED. They were the half life—the time required for the luminance to drop to half of its initial value—and the drive voltage increase rate (AVIR) averaged over the testing period.

Example 1

Ag layer, 80 nm thick, to function as the reflective anode was deposited on several glass substrates. On these surfaces prior art OLEDs each having a separate single layer HIL were fabricated. These OLEDs have an identical 200 nm NPB HTL, a 60 nm Alq EML/ETL, a reflective semitransparent, 14 nm thick MgAg cathode. The layer structure and performance of the diodes are presented in Table 2

TABLE 2

| OLED | HIL | Drive voltage (V) | Efficiency (cd/A) | AVIR (mV/h) | Half-life (hr) |
|---|---|---|---|---|---|
| 1A | $CF_x$ 1 nm | 8.6 | 3.6 | 3200 | 6 |
| 1E | $MoO_x$ 2 nm | 9.1 | 4.1 | 5 | 280 |

The OLEDs each having a different HIL exhibit comparable drive voltage and efficiency, although the OLED 1A having the single-layer $CF_x$ HIL shows slightly lower drive voltage and efficiency than the OLED 1B having the single-layer $MoO_x$ HIL. The major difference between them is in the operational stability. The OLED 1E exhibit much lower AVIR and significantly longer lifetime and when compared with the OLED 1A, which is otherwise identical in structure. Thus $MoO_x$ as a hole injection layer is preferred over the $CF_x$.

In Table 3 tabulated are the performances of OLEDs having different hole-injecting structures but are otherwise identical. These OLEDs have a common 80 nm Ag reflector, 200 nm NPB HTL, a 60 nm Alq EML/ETL, 14 nm thick MgAg cathode.

TABLE 3

| OLED | HIL (sublayer 1) | HIL (sublayer 2) | Drive voltage (V) | Efficiency (cd/A) | AVIR (mV/h) | Half-life (hr) |
|---|---|---|---|---|---|---|
| 1E | $MoO_x$ 2 nm |  | 9.1 | 4.1 | 5 | 280 |
| 1C | $MoO_x$ 2 nm | $CF_x$ 1 nm | 6.8 | 3.6 | 5 | 325 |
| 1D | $CF_x$ 1 nm | $MoO_x$ 2 nm | 9.1 | 3.9 | 7 | 210 |

The OLED 1E having a single-layer $MoO_x$ HIL, exhibits long life and reasonable drive voltage. The OLED 1C having the bilayer hole-injection structure comprising the 1 nm $CF_x$ over the 2 nm $MoO_x$ has very low drive voltage. Thus, when $CF_x$ HIL is present in addition to the $MoO_x$ HIL the drive voltage is lowered significantly. It appears that hole injection from the $CF_x$ to the NPB HTL is more efficient than the hole injection from the $MoO_x$ to the NPB HTL. The power efficiency of the OLED 1C is increased by about 25% as a result of the bilayer HIL and the operational life is improved too. The OLED 1D, however, having the hole-injecting bilayer structure including the same two HIL layers but in the reverse order as that of the OLED 1C, exhibits significantly higher drive voltage than the OLED 1C. The drive of OLED 1D and OLED 1A (Table 2) are comparable. However stability is improved by the having the $MoO_x$ HIL over the $CF_x$ (OLED 1D). Thus, the preferred bilayer HIL structure is comprised of $MoO_x$ HIL as the sublayer 1 and $CF_x$ as the sublayer 2 where the sublayer 1 contacts the metal anode and the sublayer 2, and the sublayer 2 contacts the sublayer 1 and the HTL.

In order to determine the HIL thickness effect on drive voltage, efficiency and stability several OLEDs were made with varying thickness of the sublayer 1, i.e, varying $MoO_x$ thickness, keeping the $CF_x$ layer thickness fixed. All the other layers of all OLEDs were identical. These OLEDs have a common 80 nm Ag reflector, 200 nm NPB HTL, a 60 nm Alq EML/ETL, 14 nm thick MgAg cathode. The initial electroluminescent characteristic and degradation parameters of these OLEDs presented in Table 4 show that even when the HIL sublayer 1 thickness is increased by a factor of 3 the drive voltage, efficiency and device stability remain largely unaffected.

TABLE 4

| OLED | HIL (sublayer 1) | HIL (sublayer 2) | Drive voltage (V) | Efficiency (cd/A) | AVIR (mV/h) | Half-life (hr) |
|---|---|---|---|---|---|---|
| 1B | $MoO_x$ 1 nm | $CF_x$ 1 nm | 6.7 | 3.7 | 5 | 295 |
| 1C | $MoO_x$ 2 nm | $CF_x$ 1 nm | 6.8 | 3.6 | 5 | 325 |
| 1F | $MoO_x$ 3 nm | $CF_x$ 1 nm | 7.0 | 4.4 | 5 | 285 |

The data presented in Table 2 through Table 4 show that a single layer $CF_x$ HIL in contact with Ag anode results in OLED with poor stability as evidenced by its short half-life and a large AVIR. On the other hand, a single layer $MoO_x$ HIL in contact with the Ag anode yields OLED with greatly improved stability as evidenced by its long half-life and low AVIR. However the drive voltage of OLED having a single-layer $MoO_x$ HIL, is higher than desired. Employing the bilayer HIL structure in which the $MoO_x$ HIL, the sublayer 1, is disposed adjacent to the Ag anode, and $CF_x$ HIL, the sublayer 2, contacts the NPB HTL and the sublayers 1, and the sublayer and sublayer 2 are in contact with each other the drive voltage is lowered by more than 2 volts and the stability is further improved. Having the same two HIL sublayers in reverse order as in OLED 1D (Table 3) is not effective in lowering the drive voltage.

The invention has been described in detail with particular reference to certain preferred embodiments thereof, but it will be understood that variations and modifications can be effected within the spirit and scope of the invention.

PARTS LIST

200 Organic Light-emitting diode (OLED)
201 Transparent or opaque substrate
202 Reflective, opaque, and conductive anode
203 Hole-injection layer (HIL)
204 Hole-transport layer (HTL)
205 Emissive layer (EML)
206 Electron-transport layer (ETL)
207 Reflective, semitransparent and conductive cathode
2031 Hole-injection sublayer 1
2032 Hole-injection sublayer 2
300 Organic light-emitting diode (OLED)
400 Organic light-emitting diode (OLED)
401 Transmission enhancement layer

The invention claimed is:

1. A top-emitting OLED device, comprising:
a) a transparent or an opaque substrate;
b) a reflective, opaque, and conductive anode layer including a metal or metal alloy or both formed over the substrate;
c) a plurality of hole-injecting layers disposed over the reflective, opaque, and conductive anode layer, including a bilayer structure having a layer including an oxide and a layer including a fluorinated carbon;
d) a plurality of organic layers formed over the plurality of hole-injecting layers and including an emissive layer having electroluminescent material;
e) a reflective, semitransparent and conductive cathode including a metal or metal alloy or both provided over the plurality of organic layers; and
f) the plurality of the hole-injecting layers being configured to reduce the drive voltage, and the reflectivity of the anode, the transparency of the cathode, and the thickness of the organic layers between the electrodes being selected to change the internal reflection of light to thereby improve the emission through top surface.

2. The top-emitting OLED device of claim 1 wherein the plurality of the hole-injecting layers includes an oxide and a fluorinated carbon layer.

3. The plurality of the hole-injecting layers of claim 2 wherein the oxide layer is in contact with the anode and the fluorinated carbon layer, and the fluorinated carbon layer is in contact with the oxide and the hole-transport layer.

4. The top-emitting OLED device of claim 1 wherein the plurality of organic layers includes a hole-transport layer disposed between the fluorinated carbon layer and the emissive layer.

5. The top-emitting OLED device of claim 1 wherein the plurality of organic layers includes an electron-transport layer disposed between the emissive layer and the cathode.

6. The top-emitting OLED device of claim 1, which further includes a transmission enhancement layer (TEL) over the reflective, semitransparent and conductive cathode to further improve the amount of light, which passes through the cathode.

7. The top-emitting OLED device of claim 1 wherein the reflective, opaque, and conductive anode includes Ag, Al, Mg, Zn, Rh, Ru, Ir, Au, Cu, Pd, Ni, Cr, Pt, Co, Te, Mo, Hf, Fe, Mn, Nb, Ge, Os, Ti, V, or W, or alloys or mixtures thereof.

8. The top-emitting OLED device of claim 1 wherein the reflective, semitransparent, and conductive cathode layer has of absorbance of 30% or less over visible wavelengths.

9. The top-emitting OLED device of claim 1 wherein the reflective semitransparent and conductive cathode includes metal or metal alloys having a work function selected to be about 4.0 eV or less.

10. The top-emitting OLED device of claim 1 wherein the metal or metal alloys include alloys of Ag or Al with Mg, alkali metals, alkali earth metals, or Mn.

11. The top-emitting OLED device of claim 2 wherein the oxides include ITO, IZO, $Pr_2O_3$, $TeO_2$, CuPc, $SiO_2$, $VO_x$, or $MoO_x$, or mixtures thereof wherein x is less than 3.

12. The top-emitting OLED device of claim 2 wherein the fluorinated carbon is $CF_x$ wherein x is less than 3.

13. The top-emitting OLED device of claim 8 wherein the TEL includes ITO, MgO, $MoO_x$, $SnO_2$, $TiO_2$, $Al_2O_3$, $SiO_2$, ZnO, $ZrO_2$, Alq, NPB, SiN, AlN, TiN, SiC, or $Al_4C_3$, or mixtures thereof.

14. The top-emitting OLED device of claim 6 wherein the thickness of the TEL ranges from 20 nm to 150 nm.

15. The top-emitting OLED device of claim 1 wherein the combined thickness of all layers between the anode and cathode is in the range of 70 nm to 150 nm or 230 nm to 330 nm.

16. The top-emitting OLED device of claim 1 wherein the hole transport layer includes NPB.

17. The top-emitting OLED device of claim 1 wherein the emissive layer includes Alq.

18. The top-emitting OLED device of claim 1 wherein the electron-transport layer includes Alq.

19. The top-emitting OLED device of claim 1 wherein the emissive layer contains fluorescent or phosphorescent dopants.

20. The top-emitting OLED device of claim 16 wherein the thickness of the hole-transport layer is in the range of 20 nm to 80 nm or 180 nm to 230 nm.

21. The top-emitting OLED device of claim 1 wherein the thickness of the cathode layer is in a range of from 4 nm to 50 nm.

22. The top-emitting OLED device of claim 1 wherein the thickness of the anode layer is greater than 40 nm.

* * * * *